(12) United States Patent
Oh et al.

(10) Patent No.: US 9,346,078 B2
(45) Date of Patent: May 24, 2016

(54) MASK FRAME ASSEMBLY FOR THIN FILM DEPOSITION

(71) Applicant: Samsung Display Co., LTD., Yongin, Gyeonggi-do (KR)

(72) Inventors: Yoon-Chan Oh, Yongin (KR); Choon-Ho Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 288 days.

(21) Appl. No.: 13/966,242

(22) Filed: Aug. 13, 2013

(65) Prior Publication Data

US 2014/0150721 A1   Jun. 5, 2014

(30) Foreign Application Priority Data

Nov. 30, 2012 (KR) ........................ 10-2012-0138521

(51) Int. Cl.
  *B05C 21/00*    (2006.01)
  *C23C 14/04*    (2006.01)
  *H01L 51/00*    (2006.01)

(52) U.S. Cl.
  CPC ............. *B05C 21/005* (2013.01); *C23C 14/042* (2013.01); *H01L 51/0011* (2013.01)

(58) Field of Classification Search
  CPC .. C23C 14/042; B05C 21/005; H01L 51/0011
  See application file for complete search history.

(56) References Cited

U.S. PATENT DOCUMENTS

| 2004/0104197 | A1* | 6/2004 | Shigemura et al. ............. 216/20 |
| 2011/0168087 | A1* | 7/2011 | Lee et al. ...................... 118/504 |
| 2011/0171768 | A1  | 7/2011 | Hong et al. |
| 2011/0229633 | A1* | 9/2011 | Hong et al. ................... 427/162 |
| 2012/0174863 | A1  | 7/2012 | Park |
| 2012/0266813 | A1* | 10/2012 | Hong ........................... 118/505 |

FOREIGN PATENT DOCUMENTS

| JP | 2000-313179 A   | 11/2000 |
| KR | 10-2011-0082416 A | 7/2011 |
| KR | 10-2012-0080857 A | 7/2012 |

OTHER PUBLICATIONS

EPO Search Report dated Mar. 19, 2014, for corresponding European Patent application 13193448.1, (6 pages).

* cited by examiner

*Primary Examiner* — Dah-Wei D Yuan
*Assistant Examiner* — Stephen Kitt
(74) *Attorney, Agent, or Firm* — Lewis Roca Rothgerber Christie LLP (57) ABSTRACT

A mask frame assembly for thin film deposition includes a mask frame having an opening, and a mask configured to be coupled to the mask frame and including a first surface for facing a deposition substrate, a second surface opposite the first surface, and a deformation prevention part having varying thicknesses.

23 Claims, 8 Drawing Sheets

MASK FRAME ASSEMBLY FOR THIN FILM DEPOSITION

CROSS-REFERENCE TO RELATED PATENT APPLICATION

This application claims priority to and the benefit of Korean Patent Application No. 10-2012-0138521, filed on Nov. 30, 2012, in the Korean Intellectual Property Office, the disclosure of which is incorporated herein in its entirety by reference.

BACKGROUND

1. Field

Embodiments of the present invention relate to a mask frame assembly for thin film deposition that is capable of reducing or preventing deformation of a mask.

2. Description of the Related Art

In general, an organic light-emitting display device including a thin film transistor (TFT) is used in mobile devices, such as a digital camera, a video camera, a camcorder, a personal digital assistant (PDA), a smartphone, a tablet personal computer (PC), and a flexible display device, or electronic and electric products such as an ultra-slim television (TV) and an ultra-slim laptop computer.

An organic light-emitting display device includes a first electrode and a second electrode formed on a substrate, and an organic emission layer formed between the first and second electrodes. The first electrode, the second electrode, and the organic emission layer are formed using various methods, such as a photolithographic method or a deposition method.

The photolithographic method is a wet etching method of forming a desired pattern layer by coating a photoresist on a predetermined region of a substrate. However, in the photolithographic method, during removal of the photoresist, moisture may penetrate into the organic emission layer. As such, performance and lifetime characteristics of the organic light-emitting display device may greatly deteriorate as time passes.

The deposition method is a method of forming a desired pattern layer by disposing a fine metal mask having the same pattern as a thin film layer on a substrate, and depositing a raw material for forming the thin film layer on the substrate.

However, when a mask is mounted on a mask frame, due to a tensile force applied to the mask, wave-shaped wrinkles may be generated on the mask. If wrinkles are generated, the mask may not closely contact a substrate, which may consequently prevent fine patterning.

SUMMARY

Embodiments of the present invention provide a mask frame assembly for thin film deposition that is capable of reducing or preventing wrinkles generated when a mask is mounted on a mask frame.

According to an aspect of the present invention, there is provided a mask frame assembly for thin film deposition, the mask frame assembly including a mask frame having an opening, and a mask configured to be coupled to the mask frame and including a first surface for facing a deposition substrate, a second surface opposite the first surface, and a deformation prevention part having varying thicknesses.

The mask further include deposition regions, each of which comprising deposition patterns, spaced from each other along a first direction of the mask, ribs between adjacent ones of the deposition regions, and borders at edges of the deposition regions along a second direction of the mask that crosses the first direction, and the deformation prevention part may be at the borders.

The mask may be configured to be stretched in the first direction, and two end portions of the mask may be configured to be welded to the mask frame.

The mask may include a plurality of split masks, the first direction may be a length direction of the split masks, and the second direction may be a width direction of the split masks.

A width of the mask may be less than a length of the mask, and the mask may be configured to be stretched in a length direction of the mask.

The deformation prevention part may extend at the borders along the first direction of the mask, and the deformation prevention part may include a plurality of first parts having a first thickness, and a plurality of second parts having a second thickness that is less than the first thickness.

The deformation prevention part may include a plurality of deformation prevention regions, and the deformation prevention regions may include the first and second parts alternately arranged along the first direction of the mask.

Each of the borders may include a plurality of lines along the second direction of the mask, and corresponding ones of the deformation prevention regions may be located in each line along the first direction.

A width of the deformation prevention regions in the second direction may be less than a width of the deposition regions in the first direction and may be less than a width of the ribs in the first direction.

A size of each of the deformation prevention regions in the first direction may correspond to one of the first or second parts.

The first parts may be not etched in a thickness direction of the mask, and the second parts may be half etched in the thickness direction of the mask.

The second parts may include regions of the mask that are half etched from the second surface, and may have a thickness that is less than thicknesses of other parts of the mask.

Each of the ribs may be between adjacent deposition regions, and may include a first region that is half etched and a second region that is not half etched.

The second region of the ribs may have at least one dummy pattern.

The dummy pattern may include a dot-shaped slit pattern or a strip-shaped slit pattern.

A width of the ribs in the first direction may be less than the width of the deposition regions in the first direction.

The mask may further include, at an outside of the deposition region along the first direction, a half region, a stick region, and a dummy deposition region having dummy deposition patterns.

The stick region may be not etched in a thickness direction of the mask, and may be configured to be welded to the mask frame.

The mask frame assembly may further include a first half region, a first stick region, a second half region, a dummy deposition region, and a second stick region sequentially arranged from an outside of the deposition region to an end of the mask.

The deposition patterns may include dot-shaped slit patterns or strip-shaped slit patterns.

The mask frame may include a plurality of first frames facing each other along a first direction, and a plurality of second frames facing each other along a second direction, and the plurality of first frames may be coupled to the plurality of second frames to define the opening.

The mask may include a plurality of split masks extending in a direction perpendicular to the plurality of first frames, each having two end portions configured to be fixed to the mask frame, and arranged in a direction perpendicular to the plurality of second frames.

The mask may include at least one split mask extending in a first direction to cross the opening of the mask frame.

BRIEF DESCRIPTION OF THE DRAWINGS

The above and other aspects of embodiments of the present invention will become more apparent by describing in detail exemplary embodiments thereof with reference to the attached drawings, in which:

FIG. 3 is a magnified plan view of a portion A of the split mask illustrated in

FIG. 2;

FIG. 7 is a magnified plan view of a portion B of the split mask illustrated in

FIG. 2;

DETAILED DESCRIPTION

While exemplary embodiments of the invention are susceptible to various modifications and alternative forms, specific embodiments are shown by way of example in the drawings, and will herein be described in detail. It should be understood, however, that there is no intent to limit exemplary embodiments of the invention to the particular forms disclosed, but conversely, exemplary embodiments of the invention are to cover all modifications, equivalents, and alternatives falling within the spirit and scope of the invention. In the following description of the present invention, a detailed description of known functions and configurations incorporated herein will be omitted when it may make the subject matter of the present invention less clear.

It will be understood that, although the terms first, second, etc. may be used herein to describe various elements, these elements should not be limited by the strict construction of these terms. These terms are only used to distinguish one element from another.

The terminology used herein is for the purpose of describing particular embodiments only, and is not intended to be limiting of the present invention. As used herein, the singular forms "a," "an," and "the" are intended to include the plural forms as well as the singular, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Hereinafter, embodiments of the present invention will be described in detail by explaining exemplary embodiments of the invention with reference to the attached drawings. Like reference numerals in the drawings denote like elements, and repeated descriptions thereof will be omitted.

Figure 1:
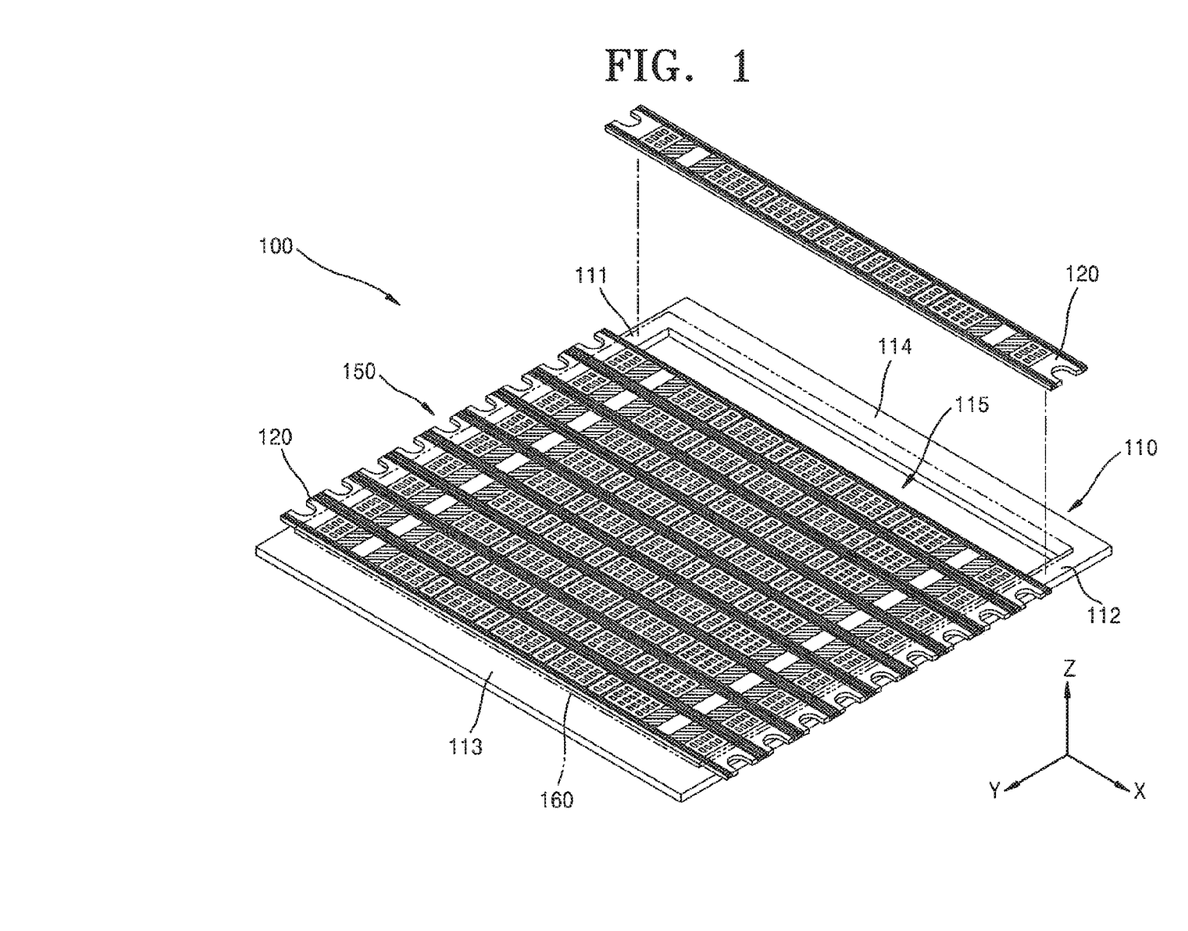
FIG. 1 is a partial perspective view of a mask frame assembly for thin film deposition, according to an embodiment of the present invention.

FIG. 1 is a partial perspective view of a mask frame assembly 100 for thin film deposition, according to an embodiment of the present invention. Referring to FIG. 1, the mask frame assembly 100 includes a mask frame 110 and a mask 150 having a plurality of split masks 120.

An opening 115 is formed in the mask frame 110, and first through fourth frames (e.g., sides of a frame) 111 through 114 are coupled to each other so as to surround the opening 115.

From among the first through fourth frames 111 through 114, the first and second frames (e.g., a first plurality of frames) 111 and 112 face each other along an X direction and extend parallel to each other along a Y direction, and the third and fourth frames (e.g., a second plurality of frames) 113 and 114 face each other along the Y direction and extend parallel to each other along the X direction. The first through fourth frames 111 through 114 are coupled to each other to form a rectangular frame 110.

The mask frame 110 may be formed of a material having little deformation when the mask 150 is welded, e.g., metal having high rigidity. The mask 150 may be combined to the mask frame 110.

For precise patterning, a shadow phenomenon may be reduced by increasing closeness of contact between (e.g., by reducing the distance between) the mask 150 and a deposition substrate 160 located on the mask 150. As such, the mask 150 may be formed as a thin plate. A material of the mask 150 may include, for example, stainless steel, INVAR (INVAR is a registered trademark of Aperam Alloys IMPHY Joint Stock Company) nickel (Ni), cobalt (Co), a Ni alloy, or a Ni—Co alloy.

If a display device has a large size, the mask 150 also has a large size. As such, the mask 130 sags due to its own weight. To prevent, or to reduce the effects of, this phenomenon, the mask 130 includes the split masks 120 divided from each other (e.g., arranged) in the Y direction.

Although the split masks 120 have a stripe shape according to the current embodiment, the present invention is not limited thereto, and the mask 150 is not limited to any one size, shape, or structure as long as the mask 150 has a width less than a length of the mask 150, the length of the mask 150 being in a direction in which the mask 150 is stretched.

In the present embodiment, the split masks 120 are divided along a width direction (Y direction) crossing a length direction (X direction) in which the mask 150 is stretched. The split masks 120 extend in a direction perpendicular to a direction in which the first and second frames 111 and 112 extend, each of the split masks 120 having two end portions fixed to the mask frame 110, and are continuously aligned (e.g., arranged, or aligned side by side) in a direction perpendicular to the third and fourth frames 113 and 114 so as to cover the opening 115.

Here, a deformation prevention part (e.g., deformation prevention part 130 of FIG. 2) is formed in at least one region of the split mask 120 to reduce or prevent wave-shaped wrinkles when the split mask 120 is stretched.

Figure 2:
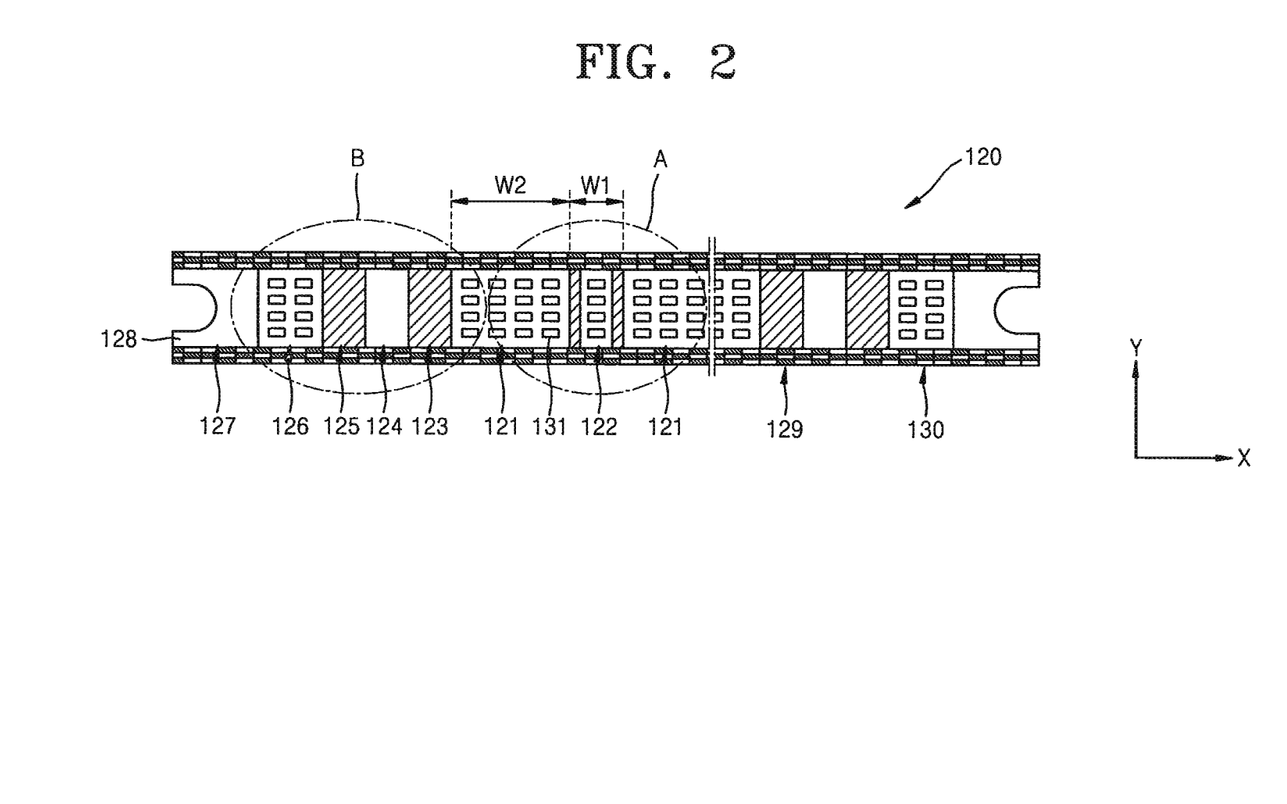
FIG. 2 is a plan view of a split mask of the embodiment illustrated in FIG. 1.

A detailed description of a split mask 120 of an embodiment of the present invention will now be provided. FIG. 2 is a plan view of the split mask 120 illustrated in FIG. 1. Referring to FIG. 2, the split mask 120 is a stripe-shaped metal plate.

A plurality of deposition regions 121 are formed on the split mask 120, and are spaced apart from each other along the length direction (X direction). A plurality of deposition patterns 131 are formed in each of the deposition regions 121.

Ribs 122 are formed between adjacent deposition regions 121 to couple adjacent deposition regions 121 to each other. A width W1 of the ribs 122 may be less than a width W2 of the deposition regions 121 to ensure sufficient regions for forming displays. A pattern layer for reducing or preventing deformation of the split mask 120 is formed in each of the ribs 122.

The deposition regions 121 and the ribs 122 are alternately aligned along the length direction (X direction) of the split mask 120. One deposition region 121 corresponds to one display formed on the deposition substrate 160 illustrated in FIG. 1, the deposition substrate 160 functioning as a mother substrate, and the number of deposition regions 121 may be changed according to the number of displays to be formed on the deposition substrate 160.

Along the width direction (Y direction) of the split mask 120, which crosses the length direction (X direction) of the split mask 120, borders 129 are formed at two edges (e.g., opposing edges) of the deposition regions 121. A deformation prevention part 130 for reducing wrinkles of the split mask 120 is formed at the borders 129, and is formed by changing a thickness of the split mask 120.

On the split mask 120, various-shaped pattern layers for preventing or reducing deformation of the split mask 120 are formed outside of the deposition region 121 (e.g., at an outermost side of the deposition region 121 along the length direction (X direction), or between an outermost deposition region 121 and an end portion 128 of the split mask 120).

According to the current embodiment, a first half region 123, a first stick region 124, a second half region 125, a dummy deposition region 126, and a second stick region 127 are formed outside of the outermost deposition region 121 (e.g., the deposition region 121 that is located at the outermost side) and extending to the end portion 128 of the split mask 120.

Welding regions are formed at two end portions 128 of the split mask 120. According to the current embodiment, welding may be performed at the first stick regions 124 of the split mask 120, and the first stick regions 124 may be welded onto the first and second frames 111 and 112 illustrated in FIG. 1 while a tensile force is applied in the length direction (X direction). As such, the split mask 120 is fixed onto the mask frame 110.

Figure 3:
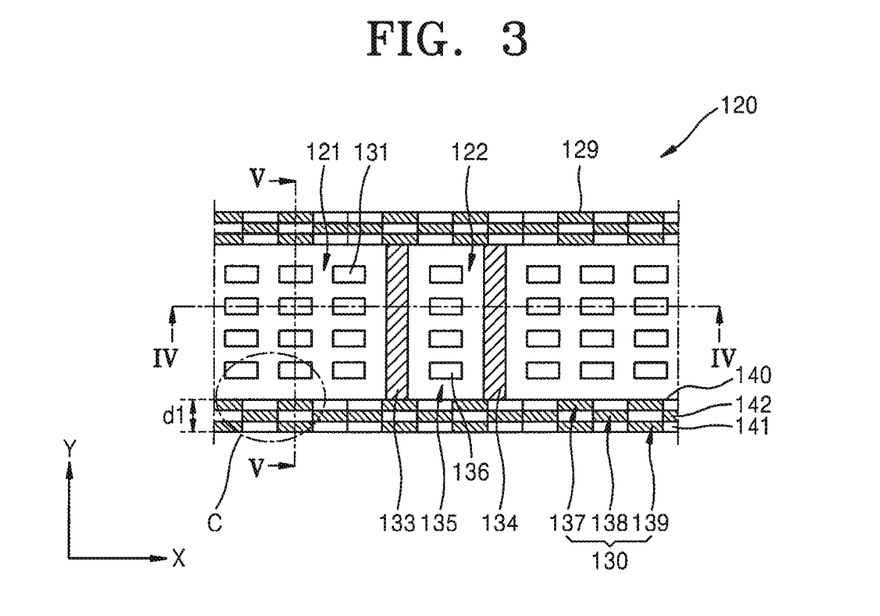
Figure 4:
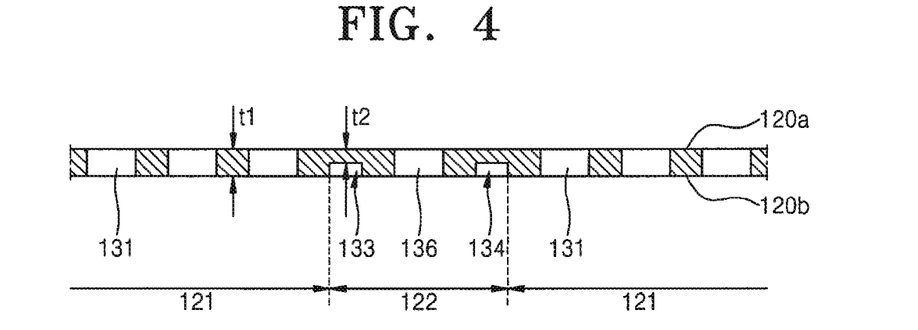
FIG. 4 is a cross-sectional view cut along the line IV-IV illustrated in FIG. 3.
Figure 5:
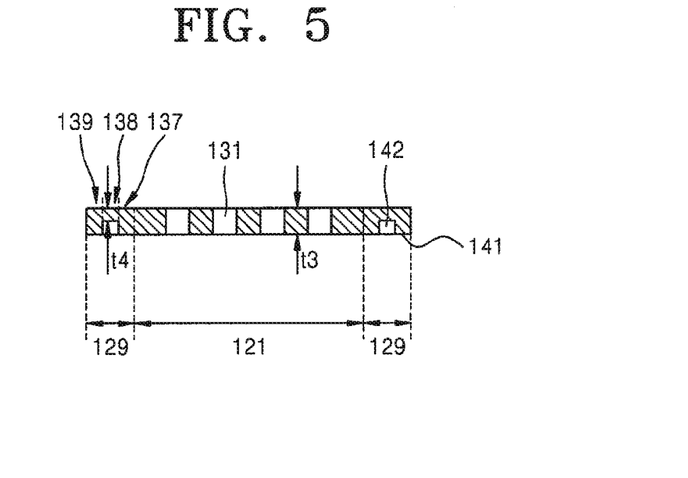
FIG. 5 is a cross-sectional view cut along the line V-V illustrated in FIG. 3.
Figure 6:
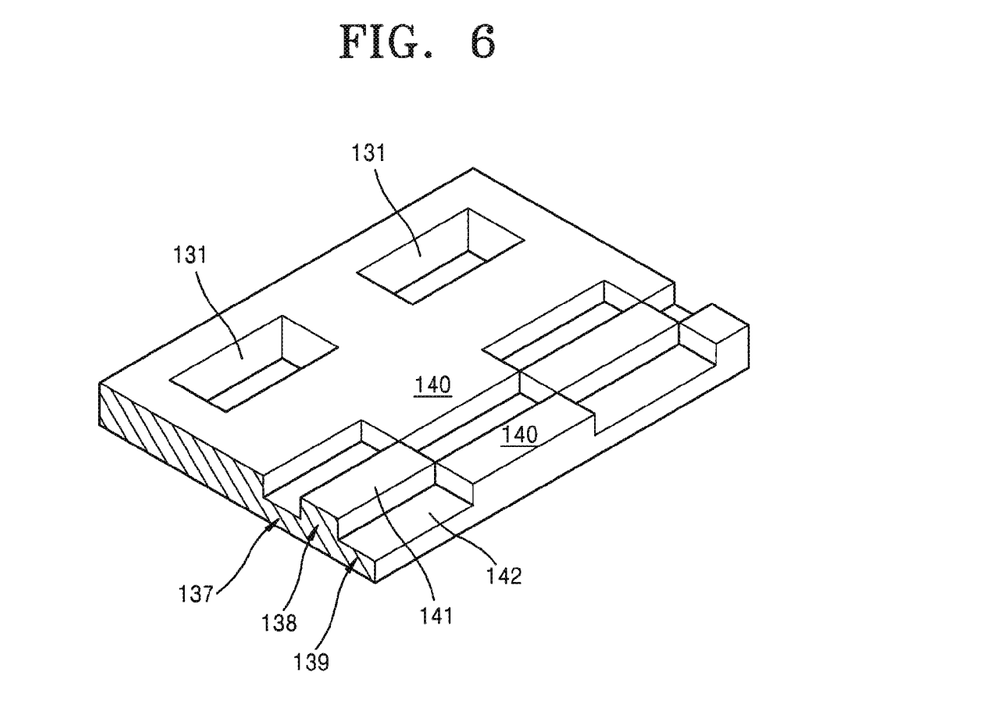
FIG. 6 is a magnified perspective view of a portion C illustrated in FIG. 3.

FIG. 3 is a magnified plan view of a portion A of the split mask 120 illustrated in FIG. 2. FIG. 4 is a cross-sectional view cut along the line IV-IV illustrated in FIG. 3. FIG. 5 is a cross-sectional view cut along the line V-V illustrated in FIG. 3. FIG. 6 is a magnified perspective view of a portion C illustrated in FIG. 3.

FIG. 3 illustrates a front surface of the split mask 120 which faces the deposition substrate 160 illustrated in FIG. 1, e.g., a first surface 120a (see FIG. 4) is shown as an upper surface, and FIG. 6 shows that the split mask 120 upside down to illustrate a rear surface of the split mask 120, e.g., a second surface 120b (see FIG. 4) is shown as an upper surface.

Referring to FIGS. 3 through 6, the deposition patterns 131 are formed in each of the deposition regions 121, and include a plurality of dot-shaped slits, although the deposition patterns 131 are not limited to the dot-shaped slits, and may include, for example, strip-shaped slits (e.g., stripe-shaped slits).

When the deposition patterns 131 are formed using an etching method, a resist layer having patterns the same as the deposition patterns 131 may be formed on a thin plate using a photoresist or a film having the patterns adhered to the thin plate, and then by etching the thin plate.

The ribs 122 are formed between adjacent deposition regions to couple adjacent deposition regions 121 to each other. The ribs 122 are formed between the deposition regions 121 in the length direction (X direction) in which the split mask 120 is stretched.

A pattern layer for preventing or reducing deformation of the split mask 120 is formed in each of the ribs 122. According to the current embodiment, each of the ribs 122 includes a first region 133 and a second region 134 respectively adjacent to a pair of deposition regions 121, and also includes a third region 135 formed between the first and second regions 133 and 134.

The first and second regions 133 and 134 are half etched regions. Referring to FIG. 4, a thickness t2 of the first and second regions 133 and 134 is about ½ of a thickness t1 of a non-etched portion of the split mask 120. In the present embodiment, the half etching may be performed to a depth (e.g., a predetermined depth) from the second surface 120b of the split mask 120, which is opposite to the first surface 120a that faces the deposition substrate 160, such that a close contact between the mask 150 and the deposition substrate 160 may be improved.

The third region 135 formed between the first and second regions 133 and 134 is a dummy deposition region that is not half etched. A thickness of the third region 135 is the same as the thickness t1 of the non-etched portion of the split mask 120.

In the present embodiment, dummy deposition patterns 136 may be further formed in the third region 135, and may include the same patterns as the deposition patterns 131 in regards to a manufacturing process. However, the present invention is not limited thereto and the dummy deposition patterns 136 may be variously shaped.

In embodiments of the present invention, if deposition of the dummy deposition patterns 136 on the deposition substrate 160 is not desired, the dummy deposition patterns 136 may be covered by using a mask in a deposition process.

As in the current embodiment, if the half etched first and second regions 133 and 134 and the third region 135 including the dummy deposition patterns 136 are formed in each of the ribs 122, when the split mask 120 is stretched, because deformation occurs (e.g., simultaneously occurs) in the deposition regions 121 and the ribs 122, flatness of the split mask 120 may be improved.

Here, when the split mask 120 is stretched, to further reduce wave-shaped wrinkles by reducing contraction of the split mask 120 in the width direction (Y direction), the deformation prevention part 130 is formed at two edges of the deposition regions 121, i.e., at the borders 129. The deformation prevention part 130 extends along the borders 129 in the length direction (X direction) in which the split mask 120 is stretched, and includes a plurality of deformation prevention regions 140 partitioned over the entire region of the borders 129.

In more detail, each of the borders 129 may be divided into a plurality of lines along the width direction (Y direction) of the split mask 120. Although first through third lines 137 through 139 are formed in a direction away from the deposition regions 121 and the ribs 122 according to the current embodiment, the number of lines is not limited thereto.

Each of the first through third lines 137 through 139 is partitioned into the deformation prevention regions 140 along the length direction of the split mask 120. Although the deformation prevention regions 140 have a rectangular shape according to the current embodiment, the deformation prevention regions 140 are not limited thereto.

The deformation prevention regions 140 collectively include a plurality of first parts 141 and a plurality of second parts 142 having a thickness different from the thickness of the first parts 141. The first and second parts 141 and 142 are alternately aligned (e.g., alternately arranged) over the entire region of the deformation prevention regions 140. Each of the first and second parts 141 and 142 has a size corresponding to one deformation prevention region 140.

Referring to FIG. 5, the first parts 141 are not etched in a thickness direction of the split mask 120, and have a thickness t3. However, the second parts 142 are half etched in the thickness direction of the split mask 120, and have a thickness t4.

In the present embodiment, the half etching is performed to a depth (e.g., a predetermined depth) from the second surface 120b of the split mask 120, which is opposite to the first surface 120a of the split mask 120 that faces the deposition substrate 160. As described above, the thickness t4 of the second parts 142 is about ½ of the thickness t3 of the first parts 141.

Also, a distance dl (see FIG. 3) of the deformation prevention regions 140 in which the first and second parts 141 and 142 are formed (e.g., a width of the deformation prevention regions 140 in the width direction/Y direction) is less than the width W1 of the ribs 122 (e.g., in the length direction/X direction) or the width W2 of the deposition regions 121 (e.g., in the length direction/X direction) in FIG. 2

As described above, because the deformation prevention part 130 is formed, when the split mask 120 is stretched in the length direction (X direction), deformation of the split mask 120 is absorbed (e.g., reduced) by its two edges. Accordingly, wrinkles of the split mask 120 in the width direction (Y direction) may be further reduced.

Figure 7:
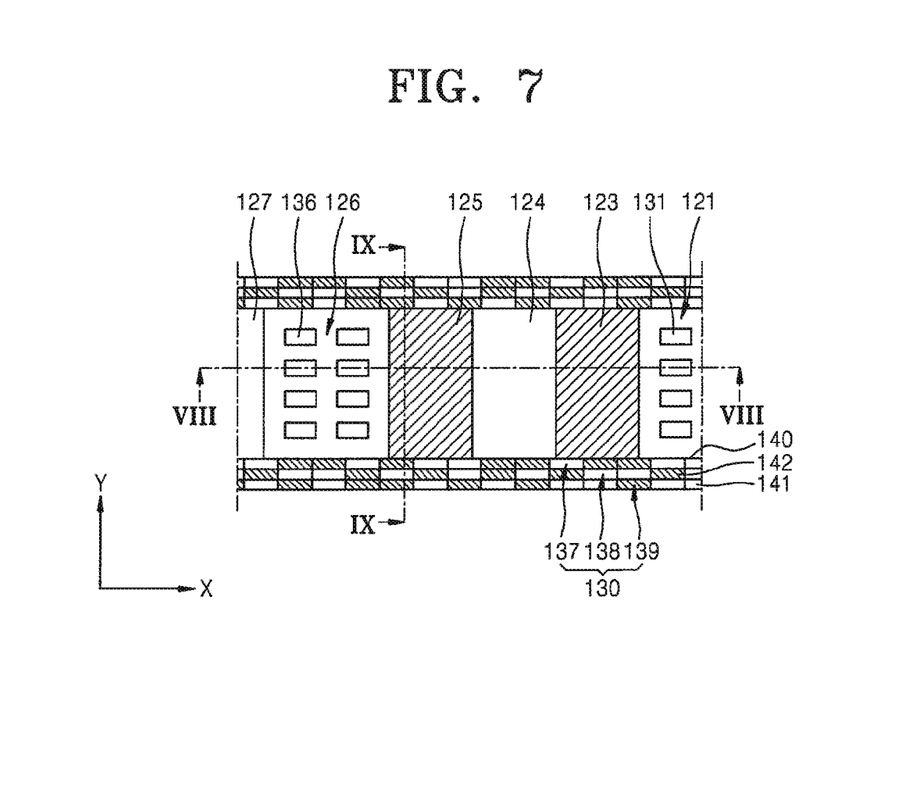
Figure 8:
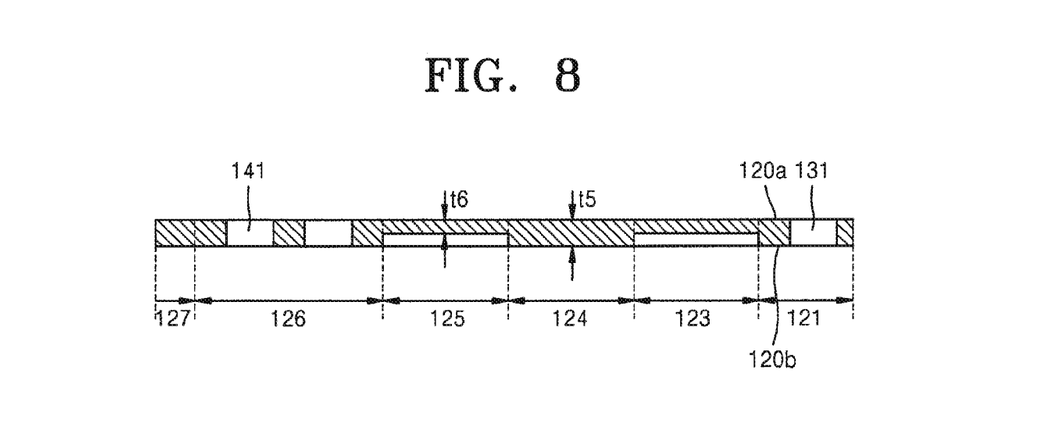
FIG. 8 is a cross-sectional view cut along the line VIII-VIII illustrated in FIG. 7.
Figure 9:
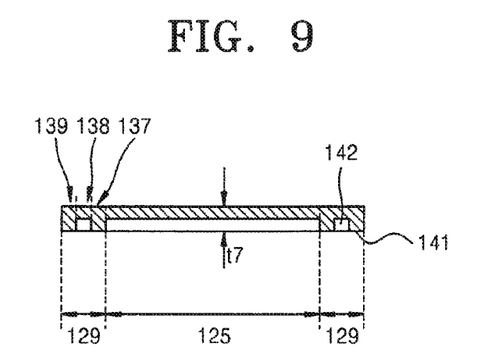
FIG. 9 is a cross-sectional view cut along the line IX-IX illustrated in FIG. 7.

FIG. 7 is a magnified plan view of a portion B of the split mask 120 illustrated in FIG. 2. FIG. 8 is a cross-sectional view cut along the line VIII-VIII illustrated in FIG. 7. FIG. 9 is a cross-sectional view cut along the line IX-IX illustrated in FIG. 7.

Referring to FIGS. 7 through 9, on the split mask 120, the first half region 123 is formed at the outside of the deposition region 121 that is located at the outermost side along the length direction (X direction). The first half region 123 is a region etched to a depth (e.g., a predetermined depth) from the second surface 120b of the split mask 120.

The first stick region 124 is formed outside the first half region 123 (e.g., between the first half region 123 and the end portion 128), and is not etched in the thickness direction of the split mask 120. Although welding is performed in the first stick region 124 according to the current embodiment, the present invention is not limited thereto.

The second half region 125 is formed outside the first stick region 124 (e.g., between the first stick region 124 and the end portion 128). Like the first half region 123, the second half region 125 is etched (e.g., etched to a predetermined depth from the second surface 120b of the split mask 120).

The dummy deposition region 126 is formed outside the second half region 125 (e.g., between the second half region 125 and the end portion 128). The dummy deposition patterns 136 may be further formed in the dummy deposition region 126. The dummy deposition patterns 136 of the present embodiment include dot-shaped slit patterns or strip-shaped slit patterns, and may include the same patterns as the deposition patterns 131 in regards to a manufacturing process.

The dummy deposition regions 126 are formed near the two end portions 128 in the length direction (X direction) of the split mask 120 to reduce overall deformation of the split mask 120 by distributing relatively large deformation of the deposition regions 121 to the dummy deposition regions 126 when the split mask 120 is stretched.

The second stick region 127 is formed outside the dummy deposition region 126 (e.g., between the dummy deposition region 126 and the end portion 128), and is a region not etched in the thickness direction of the split mask 120. Welding may be performed on the second stick region 127 instead of the first stick region 124.

In the present embodiment, the deformation prevention part 130 is formed at the borders 129 extending along the length direction (X direction) in which the split mask 120 is stretched. The deformation prevention part 130 includes the deformation prevention regions 140, which include the first parts 141, and the second parts 142 having a thickness different from the thickness of the first parts 141. The first and second parts 141 and 142 are alternately aligned, or alternately arranged, over the entirety of the deformation prevention regions 140.

As described above, because the first half region 123, the first stick region 124, the second half region 125, the dummy deposition region 126 including the dummy deposition patterns 136, and the second stick region 127 are sequentially formed at a side of the end portion 128 of the split mask 120 in the length direction (X direction), and because the deformation prevention part 130 including the first and second parts 141 and 142 having different thicknesses is formed at the borders 129 in the width direction (Y direction) of the split mask 120, deformation generated when the split mask 120 is stretched may be distributed, and thus overall deformation of the split mask 120 may be reduced.

Figure 10:
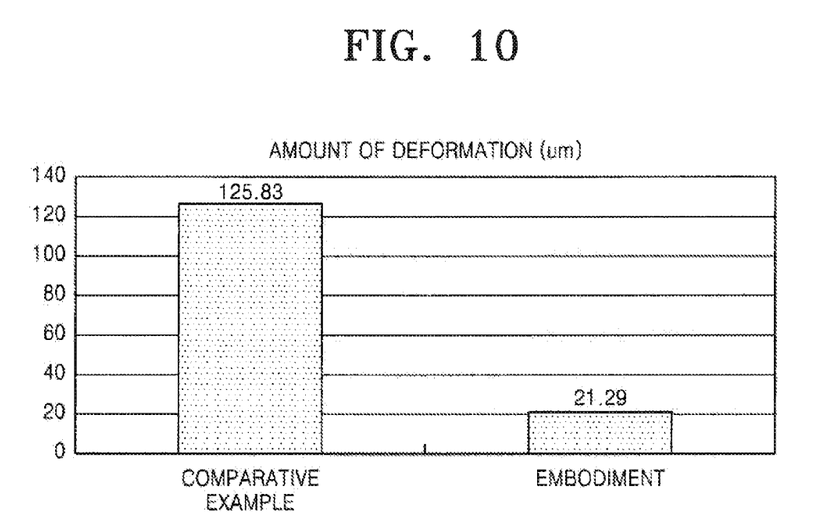
FIG. 10 is a graph for comparing amounts of deformation when masks are stretched using a comparative example and an example embodiment of the present invention.

FIG. 10 is a graph for comparing amounts of deformation (e.g., wave-shaped wrinkles) of masks, according to a test of a comparative example and an embodiment of the present invention.

In FIG. 10, a comparative example shows a conventional case when deposition regions are formed along a width direction of a mask, and dummy deposition regions are formed in ribs between the deposition regions, and an embodiment of the present invention shows a case when deposition regions are formed along a width direction of a mask, dummy deposition regions are formed in ribs between the deposition regions, and a deformation prevention part is additionally formed at borders in the width direction.

Referring to FIG. 10, when the mask according to the comparative example is stretched by 0.01%, a maximum height of wave-shaped wrinkles in a width direction is about 125.83 micrometers. However, when the mask according to an embodiment of the present invention is stretched by 0.01%, a maximum height of wave-shaped wrinkles in a width direction is about 21.29 micrometers.

As described above, in comparison to the mask according to the comparative example, the mask of an embodiment of the present invention may reduce the height of the wave-shaped wrinkle by about 17%.

Figure 11:
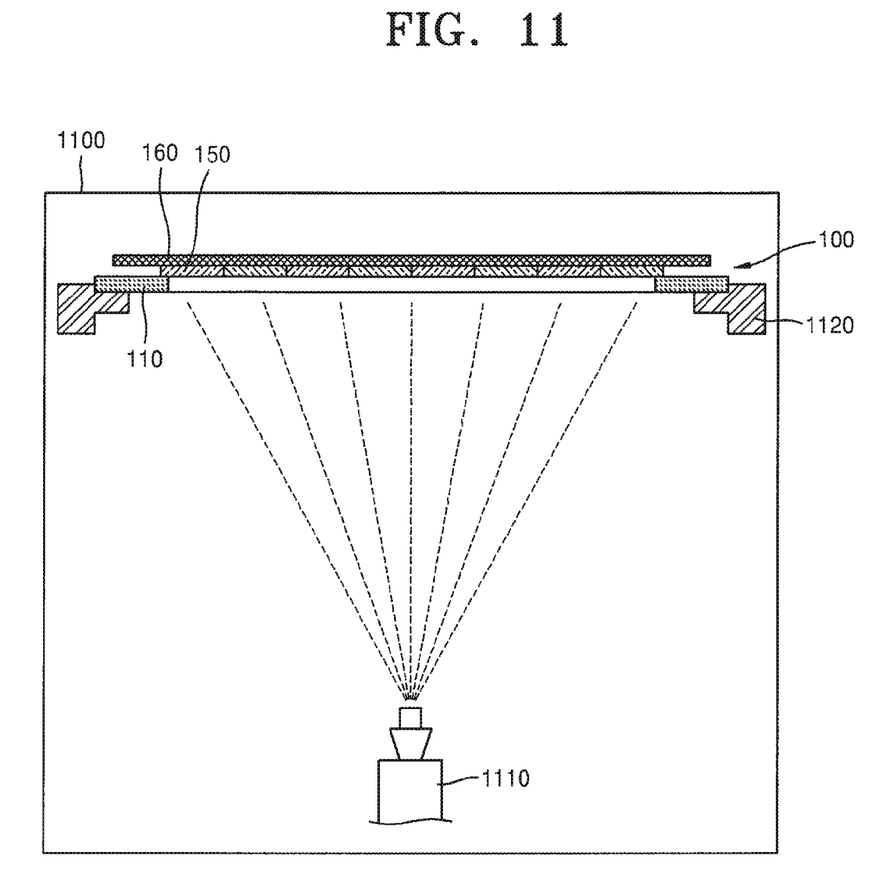
FIG. 11 is a structural view showing deposition using the mask frame assembly of the embodiment illustrated in FIG. 1, according to an embodiment of the present invention.

FIG. 11 is a structural view showing deposition using the mask frame assembly 100 of the embodiment illustrated in FIG. 1, according to an embodiment of the present invention.

Referring to FIG. 11, to deposit an organic emission layer or an electrode of an organic light-emitting display device using the mask frame assembly 100, a vacuum chamber 1100 is prepared.

A deposition source 1110 is located at a lower portion of the vacuum chamber 1100, and the mask frame assembly 100 is located above the deposition source 1110. The deposition substrate 160 is located on the mask 150. A supporting member 1120 for fixing the mask frame assembly 100 may be further formed at edges of the mask frame assembly 100.

A process of depositing a deposition material on a desired portion of the deposition substrate 160 will now be briefly described. Initially, the mask frame assembly 100 is fixed by the supporting member 1120, and the deposition substrate 160 is located on the mask 150. Then, a deposition material is sprayed toward the mask frame assembly 100 from the deposition source 1110 located at the lower portion of the vacuum chamber 1100. Because of the deposition patterns 121 formed in the mask 150, as illustrated in FIG. 2, the deposition material is deposited on a surface of the deposition substrate 160 to a desired pattern.

In the present embodiment, as illustrated in FIG. 3, because (in each of the split masks 120 included in the mask 150) the third region 135 including the dummy deposition patterns 136 is formed in each of the ribs 122, which are formed between the deposition regions 121 in which the deposition patterns 131 are formed, and because the deformation prevention part 130 including the first and second parts 141 and 142 having different thicknesses is formed at the borders 129 formed at two edges of the deposition regions 121, the generation of wave-shaped wrinkles in a width direction when the split mask 120 is stretched may be reduced or minimized. Accordingly, the quality of deposition may be improved.

Figure 12:
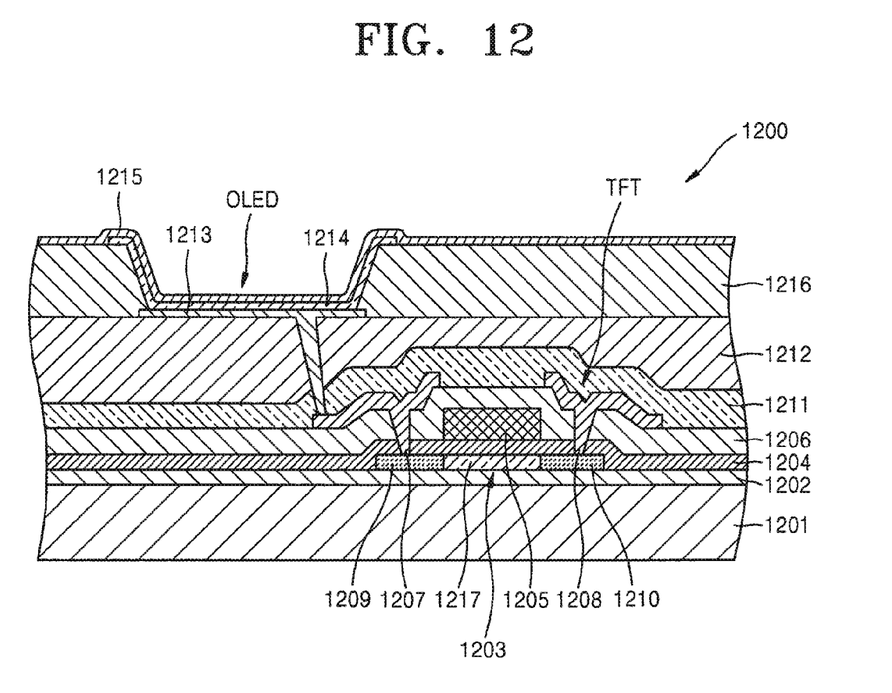
FIG. 12 is a cross-sectional view of an organic light-emitting display device formed using the mask frame assembly of the embodiment illustrated in FIG. 1, according to an embodiment of the present invention.

FIG. 12 is a cross-sectional view of a sub-pixel of an organic light-emitting display device 1200 deposited and formed using the mask frame assembly 100 illustrated in FIG. 1, according to an embodiment of the present invention.

In the present embodiment, the sub pixel includes at least one thin film transistor (TFT) and an organic light-emitting diode (OLED). The TFT is not limited to the structure illustrated in FIG. 12, and the number and structure of TFTs may be variously changed.

Referring to FIG. 12, a buffer layer 1202 is formed on a substrate 1201, which may be formed of, for example, glass or plastic. A semiconductor active layer 1203 having a predetermined pattern is formed on the buffer layer 1202. The semiconductor active layer 1203 may be formed of, for example, polycrystalline silicon. However, the semiconductor active layer 1203 is not limited thereto, and may be formed of an oxide semiconductor. For example, the oxide semiconductor may include oxide of a material selected from Group 12, Group 13, and Group 14 metal elements such as zinc (Zn), indium (In), gallium (Ga), tin (Sn), cadmium (Cd), germanium (Ge), hafnium (Hf), and combinations thereof. For example, the semiconductor active layer 1203 may include G—I—Z—O[$In_2O_3$)a($Ga_2O_3$)b(ZnO)c] (where a, b, and c are real numbers that satisfy a≥0, b≥0, and c≥0).

A gate insulating layer 1204 is formed on the semiconductor active layer 1203, and a gate electrode 1205 is formed on a region of the gate insulating layer 1204. The gate electrode 1205 is electrically connected to a gate line for applying TFT on/off signals. An interlayer insulating layer 1206 is formed on the gate electrode 1205, and a source electrode 1207 and a drain electrode 1208 are formed to respectively contact a source region 1209 and a drain region 1210 of the semiconductor active layer 1203 via contact holes. A region between the source region 1209 and the drain region 1210 is a channel region 1217 on which no impurity is doped.

A passivation layer 1211 is formed on the source electrode 1207 and the drain electrode 1208 by using, for example, $SiO_2$ or SiNx. A planarization layer 1212 is formed on the passivation layer 1211 by using an organic material such as, for example, acryl, polyimide, or benzocyclobutene (BCB).

A pixel electrode 1213 functioning as an anode of the OLED is formed on the planarization layer 1212, and a pixel defining layer 1216 is formed using an organic material to cover the pixel electrode 1213 and the planarization layer 1212. After an opening is formed in the pixel defining layer 1216 (e.g., to expose a portion of the pixel electrode 1213), an organic layer 1214 is formed on the pixel defining layer 1216 (e.g., on portions of the pixel defining layer 1216) and on the portion of the pixel electrode 1213 exposed by the opening. The organic layer 1214 includes an emission layer. However, the present invention is not limited to the above structure, and various organic light-emitting apparatus structures may be applied.

The OLED is used to display image information by emitting light of red, green, and blue according to the flow of a current, and includes a first electrode electrically connected to the source electrode 1207 of the TFT for receiving power therefrom (e.g., the pixel electrode 1213 for receiving a positive voltage), a second electrode covering an entire pixel and for supplying power (e.g., a counter electrode 1215 for supplying a negative voltage), and the organic layer 1214 located between the pixel electrode 1213 and the counter electrode 1215 for emitting light.

The pixel electrode 1213 and the counter electrode 1215 are insulated from each other by the organic layer 1214, and voltages having different polarities are applied across the organic layer 1214 to allow the organic layer 1214 to emit light.

In the present embodiment, the pixel electrode 1213 functions as an anode, and the counter electrode 1215 functions as a cathode, although the polarities of the pixel electrode 1213 and the counter electrode 1215 may be switched.

The pixel electrode 1213 may be formed as a transparent electrode or a reflective electrode. If the pixel electrode 1213 is formed as a transparent electrode, indium tin oxide (ITO), indium zinc oxide (IZO), zinc oxide (ZnO), or indium oxide ($In_2O_3$) may be used. If the pixel electrode 1213 is formed as a reflective electrode, a reflective layer may be formed by using silver (Ag), magnesium (Mg), aluminum (Al), platinum (Pt), palladium (Pd), gold (Au), nickel (Ni), neodymium (Nd), iridium (Ir), chromium (Cr), or a compound thereof, and then ITO, IZO, ZnO, or $In_2O_3$ may be formed thereon.

The counter electrode 1215 may also be formed as a transparent electrode or a reflective electrode. If the counter electrode 1215 is formed as a transparent electrode, since the counter electrode 1215 functions as a cathode, metal having a small work function, e.g., lithium (Li), calcium (Ca), lithium fluoride/calcium (LiF/Ca), lithium fluoride/aluminum (LiF/Al), aluminum (Al), silver (Ag), magnesium (Mg), or a compound thereof, may be deposited toward the organic layer 1214, and then an auxiliary electrode layer may be formed thereon by using a transparent electrode forming material such as ITO, IZO, ZnO, or $In_2O_3$. If the counter electrode 1215 is formed as a reflective electrode, Li, Ca, LiF/Ca, LiF/Al, Al, Ag, Mg, or a compound thereof may be deposited on a whole surface (e.g., on the organic layer 1214 and the pixel defining layer 1216).

The pixel electrode 1213 is formed as the transparent or reflective electrode to correspond to an opening of a sub pixel. Also, the counter electrode 1215 may be formed by depositing the transparent or reflective electrode on an entire surface of a display region. However, the counter electrode 1215 need not be deposited on the entire display region, and may be formed in various patterns. In other embodiments of the present invention, the positions of the pixel electrode 1213 and the counter electrode 1215 may be switched.

The organic layer 1214 may be formed as a low-molecular or high-molecular organic layer. If the organic layer 1214 is formed as a low-molecular organic layer, the low-molecular organic layer may be formed by stacking a hole injection layer (HIL), a hole transport layer (HTL), an emission layer (EML), an electron transport layer (ETL), an electron injection layer (EIL), etc. in a monolayer or multilayer structure. Also, various low-molecular organic materials, such as copper phthalocyanine (CuPc), N,N'-di(naphthalene-1-yl)-N,N'-diphenyl-benzidine (NPB), and tris-8-hydroxyquinoline aluminum (Alq3), may be used. The low-molecular organic layer may be formed using a vacuum deposition method.

If the organic layer 1214 is formed as a high-molecular organic layer, the high-molecular organic layer includes an HTL and an EML. The HTL may be formed of poly(3,4-ethylenedioxythiophene) (PEDOT), and the EML may be formed of a high-molecular organic material such as a poly-phenylenevinylene (PPV)-based material or a polyfluorene-based material by using, for example, a screen printing method or an inkjet printing method. However, the organic layer 1214 is not limited to the above described embodiments, and various embodiments may be applied.

As described above, in a mask frame assembly for thin film deposition, according to the described embodiments, even when a mask is stretched and welded onto a mask frame, deformation of the mask due to wrinkles may be reduced or minimized. Accordingly, errors corresponding to the contact between the mask and a substrate may be reduced or minimized, and thus the quality of deposition may be improved.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A mask frame assembly for thin film deposition, the mask frame assembly comprising:
    a mask frame having an opening; and
    a mask coupled to the mask frame and comprising:
        a first surface for facing a deposition substrate;
        a second surface opposite the first surface; and
        a deformation prevention part comprising a plurality of first parts having a first thickness, and a plurality of second parts having a second thickness that is less than the first thickness,
        wherein the first and second parts are alternately arranged in a first direction of the mask, and are alternately arranged in a second direction of the mask that is perpendicular to the first direction.

2. The mask frame assembly of claim 1, wherein the mask further comprises:
    deposition regions, each of which comprising deposition patterns, spaced from each other along the first direction of the mask;
    ribs between adjacent ones of the deposition regions; and
    borders at edges of the deposition regions along the second direction of the mask,
    wherein the deformation prevention part is at the borders.

3. The mask frame assembly of claim 2, wherein the mask is stretched in the first direction, and
    wherein two end portions of the mask are welded to the mask frame.

4. The mask frame assembly of claim 2, wherein the mask comprises a plurality of split masks,
    wherein the first direction is a length direction of the split masks, and
    wherein the second direction is a width direction of the split masks.

5. The mask frame assembly of claim 4, wherein a width of the mask is less than a length of the mask, and
    wherein the mask is stretched in a length direction of the mask.

6. The mask frame assembly of claim 2, wherein the deformation prevention part extends at the borders along the first direction of the mask.

7. The mask frame assembly of claim 6, wherein the deformation prevention part comprises a plurality of deformation prevention regions.

8. The mask frame assembly of claim 7, wherein each of the borders comprises a plurality of lines arranged in the second direction of the mask and extending in the first direction, and
    wherein corresponding ones of the deformation prevention regions are located in each line along the first direction.

9. The mask frame assembly of claim 7, wherein a width of the deformation prevention regions in the second direction is less than a width of the deposition regions in the first direction and is less than a width of the ribs in the first direction.

10. The mask frame assembly of claim 7, wherein a size of each of the deformation prevention regions in the first direction corresponds to one of the first or second parts.

11. The mask frame assembly of claim 6, wherein the first parts are not etched in a thickness direction of the mask, and
    wherein the second parts are etched in the thickness direction of the mask.

12. The mask frame assembly of claim 11, wherein the second parts comprise regions of the mask that are etched from the second surface, and wherein the second thickness is less than thicknesses of other parts of the mask.

13. The mask frame assembly of claim 2, wherein each of the ribs is between adjacent deposition regions, and comprises a first region that is etched and a second region that is not etched.

14. The mask frame assembly of claim 13, wherein the second region of the ribs has at least one dummy pattern.

15. The mask frame assembly of claim 14, wherein the dummy pattern comprises a dot-shaped slit pattern or a strip-shaped slit pattern.

16. The mask frame assembly of claim 13, wherein a width of the ribs in the first direction is less than the width of the deposition regions in the first direction.

17. The mask frame assembly of claim 2, wherein the mask further comprises, at an outside of the deposition region along the first direction:
    a half region;
    a stick region; and
    a dummy deposition region having dummy deposition patterns.

18. The mask frame assembly of claim 17, wherein the stick region is not etched in a thickness direction of the mask, and is welded to the mask frame.

19. The mask frame assembly of claim 2, further comprising a first half region, a first stick region, a second half region, a dummy deposition region, and a second stick region sequentially arranged from an outside of the deposition region to an end of the mask.

20. The mask frame assembly of claim 2, wherein the deposition patterns comprise dot-shaped slit patterns or strip-shaped slit patterns.

21. The mask frame assembly of claim 1, wherein the mask frame comprises a plurality of first frames facing each other along a first direction, and a plurality of second frames facing each other along a second direction, and wherein the plurality of first frames are coupled to the plurality of second frames to define the opening.

22. The mask frame assembly of claim 21, wherein the mask comprises a plurality of split masks extending in a direction perpendicular to the plurality of first frames, each having two end portions fixed to the mask frame, and arranged in a direction perpendicular to the plurality of second frames.

23. The mask frame assembly of claim 1, wherein the mask comprises at least one split mask extending in a first direction to cross the opening of the mask frame.

* * * * *